US012672571B2

(12) United States Patent
Takagi et al.

(10) Patent No.: US 12,672,571 B2
(45) Date of Patent: Jun. 30, 2026

(54) ELECTRONIC DEVICE

(71) Applicant: DENSO CORPORATION, Kariya-city (JP)

(72) Inventors: Kenichiro Takagi, Nisshin-city (JP); Akira Tokumasu, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 389 days.

(21) Appl. No.: 18/533,441

(22) Filed: Dec. 8, 2023

(65) Prior Publication Data

US 2024/0112967 A1      Apr. 4, 2024

Related U.S. Application Data

(63) Continuation of application No. PCT/JP2022/021599, filed on May 26, 2022.

(30) Foreign Application Priority Data

Jun. 18, 2021    (JP) ................................. 2021-101563

(51) Int. Cl.
*H10W 42/60*        (2026.01)
*H10W 70/68*        (2026.01)
*H10W 70/69*        (2026.01)

(52) U.S. Cl.
CPC ........... *H10W 70/68* (2026.01); *H10W 70/69* (2026.01)

(58) Field of Classification Search
CPC ...... H10W 42/60; H10W 70/68; H10W 70/69
See application file for complete search history.

(56) References Cited

U.S. PATENT DOCUMENTS

| | | | |
|---|---|---|---|
| 2002/0021081 A1 | 2/2002 | Tajima et al. | |
| 2016/0004110 A1* | 1/2016 | Imai ...................... | G02F 1/1341 |
| | | | 156/291 |
| 2020/0295145 A1* | 9/2020 | Tsuchitani ........... | H10D 64/115 |

FOREIGN PATENT DOCUMENTS

| | | |
|---|---|---|
| JP | 2006-222093 A | 8/2006 |
| JP | 2020-77744 A | 5/2020 |

OTHER PUBLICATIONS

Aug. 16, 2022 International Search Report issued in International Patent Application No. PCT/JP2022/021599.

* cited by examiner

*Primary Examiner* — Errol V Fernandes
(74) *Attorney, Agent, or Firm* — Oliff PLC

(57) ABSTRACT

An electronic device includes a substrate and circuitry mounted thereon. In plan view in a thickness direction of the substrate, the first conductive portion includes a rounded convex corner, and the second conductive portion includes a concave corner facing the convex corner. Extensions of two straight lines contiguous to the convex corner intersect at a first apex of a convex angle. Extensions of two straight lines contiguous to the concave corner intersect at a second apex of a concave angle. A distance between a convex corner point and a concave corner point is greater than a distance between the first apex and the second apex, where the convex corner point is an intersection of a corner line passing through the first apex and the second apex, and the convex corner, and the concave corner point is an intersection of the corner line and the concave corner.

5 Claims, 8 Drawing Sheets

FIG.3

FIRST COMPARATIVE EXAMPLE

FIRST EMBODIMENT

\<FIRST COMPARATIVE EXAMPLE\>

\<FIRST EMBODIMENT\>

\<FIRST MODIFICATION\>

\<SECOND MODIFICATION\>

\<THIRD MODIFICATION\>

\<FOURTH MODIFICATION\>

\<FIFTH MODIFICATION\>

\<SIXTH MODIFICATION\>

ELECTRONIC DEVICE

CROSS-REFERENCE TO RELATED APPLICATION

This application is a continuation application of International Application No. PCT/JP2022/021599 filed May 26, 2022 which designated the U.S. and claims priority to Japanese Patent Application No. 2021-101563 filed with the Japan Patent Office on Jun. 18, 2021, the contents of each of which are incorporated herein by reference.

BACKGROUND

Technical Field

The present disclosure relates to electronic devices each equipped with a substrate and a circuit mounted thereon.

Related Art

In some electronic devices each equipped with a substrate and circuitry mounted thereon, the circuitry includes a first conductive portion as well as a second conductive portion adjacent to the first conductive portion, where the second conductive portion is at a different potential from the first conductive portion. Thus, it is necessary to provide a creepage distance between the first and second conductive portions to prevent electrical discharge. However, for the purpose of reducing the size of the substrate, such a creepage distance should be kept as small as possible.

To this end, some electronic devices have at least one of the first and second conductive portions encapsulated by an insulating resin in order to suppress electrical discharge without providing the creepage distance.

According to such a known technology, filling the discharge space with an encapsulating resin can suppress discharge without relying on the creepage distance. Therefore, the area of the substrate can be reduced.

BRIEF DESCRIPTION OF THE DRAWINGS

In the accompanying drawings:

FIG. 3 is an enlarged plan view of a portion of FIG. 2;

DESCRIPTION OF SPECIFIC EMBODIMENTS

Figure 1:
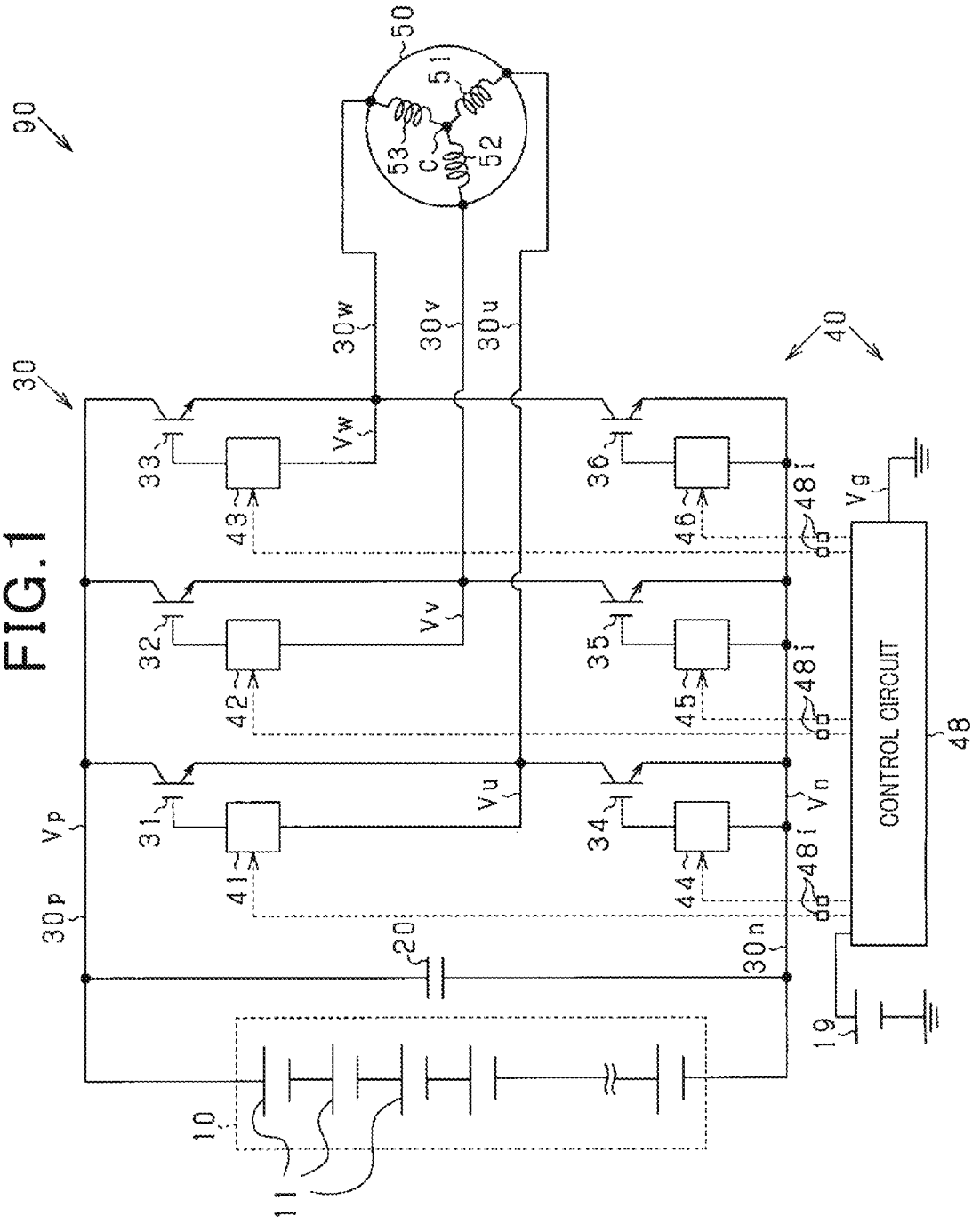
FIG. 1 is a circuit diagram illustrating an electronic device and its surroundings according to a first embodiment.

In the above known technology, as disclosed in JP 2020-77744 A, however, encapsulating conductors with an encapsulating resin needs the encapsulating resin, which leads to an increased cost for materials. In addition, recesses are needed to hold the encapsulating resin in a fluid state during manufacturing. The manufacturing cost thus increases due to providing the recesses. Furthermore, a process to solidify the encapsulating resin after pouring it into the recesses leads to an additional manufacturing cost. Furthermore, since the conductors are encapsulated with the encapsulating resin that is different from materials of the substrate, there is a concern about degradation of insulation due to peeling of resin over time.

In view of the foregoing, it is desired to have a technique for suppressing discharge while suppressing concerns about increased costs for materials and manufacturing, as well as insulation degradation due to aging.

One aspect of the present disclosure provides an electronic device including a substrate, and circuitry mounted on the substrate. The circuitry includes a first conductive portion and a second conductive portion at a different potential from the first conductive portion.

In plan view in a thickness direction of the substrate, the first conductive portion includes a rounded convex corner, and the second conductive portion includes a concave corner facing the convex corner. In plan view in the thickness direction of the substrate, extensions of two straight lines forming a contour of the first conductive portion, contiguous to the convex corner, form a convex angle at a first apex, and extensions of two straight lines forming a contour of the second conductive portion, contiguous to the concave corner, form a concave angle at a second apex.

In plan view in the thickness direction of the substrate, a straight line passing through the first apex and the second apex is referred to as a corner line. An intersection of the corner line and the convex corner is referred to as a convex corner point. An intersection of the corner line and the concave corner is referred to as a concave corner point. In plan view in the thickness direction of the substrate, a distance between corners, which is a distance between the convex corner point and the concave corner point, is greater than a distance between apices, which is a distance between the first apex and the second apex.

The present inventors have found the following fact in the case where the convex corner has an apex of a convex angle and the concave corner has an apex of a concave angle. That is, discharge between the first and second conductive portions is not necessarily initiated where the first and second conductive portions face each other at a creepage distance and are closest to each other, for example, in a parallel section. In many cases, it is initiated between the apex of the convex corner of the first conductive portion and the apex of the concave corner of the second conductive portion, even though they are farther apart than in the parallel section. That is, it has been found that initiation of discharge on the corner line passing through the apex of the convex corner and the apex of the concave corner is, in many cases, the rate-limiting factor for insulation breakdown.

In this respect, according to the aspect of the present disclosure, the convex corner is rounded. This allows the electric field concentration at an apex portion of the convex corner to be suppressed as much as possible, thereby suppressing discharge at the apex portion of the convex corner.

Furthermore, the distance between corners is greater than the distance between apices. That is, for example, the distance between the convex corner and the concave corner is greater than in a case where the convex corner is rounded and the concave corner is rounded parallel to the rounded convex corner. This can further suppress electrical discharge by increasing the distance from the first conductive portion to the second conductive portion on the corner line, which is the rate-limiting factor for insulation breakdown, as much as possible.

Moreover, according to the above configuration, discharge can be suppressed only by circuit design, without use of an encapsulating resin or the like, which can also suppress cost increases in materials and manufacturing. Furthermore, since there is no need to encapsulate the conductors with the encapsulating resin or the like, there is no concern about degradation of insulation due to resin peeling caused by aging.

According to the present disclosure, discharge can be suppressed while suppressing concerns about cost increases in materials and manufacturing, as well as insulation degradation due to aging.

Specific embodiments of the present disclosure will now be described with reference to the drawings. However, the present disclosure is not limited to these embodiments and can be implemented with modifications, as appropriate, without departing from the gist of the disclosure.

First Embodiment

FIG. 1 is a circuit diagram illustrating the switch drive device 40 that is the electronic device of the present embodiment, and its surroundings. A main battery 10, an inverter 30, the switch drive device 40, and a 3-phase coil 50 are mounted to a vehicle 90. In the following, being electrically connected is simply referred to as being "connected."

The main battery 10 includes a plurality of cell batteries 11 connected in series. Each cell battery 11 is a lithium-ion battery or the like. A positive wiring 30p is connected to the positive electrode of the main battery 10, and a negative wiring 30n is connected to the negative electrode of the main battery 10. The positive wiring 30p and the negative wiring 30n are connected via a smoothing capacitor 20. Hereafter, a potential at the positive wiring 30p is referred to as a positive-electrode potential Vp and a potential at the negative wiring 30n is referred to as a negative-electrode potential Vn.

The inverter 30 includes a total of six switches 31-36, consisting of three upper switches 31-33 and three lower switches 34-36. The three upper switches 31-33 consist of a U-phase upper switch 31, a V-phase upper switch 32, and a W-phase upper switch 33. On the other hand, the three lower switches 34-36 consist of a U-phase lower switch 34, a V-phase lower switch 35, and a W-phase lower switch 36.

Each of these six switches 31-36 is a semiconductor switch (IGBT in FIG. 1), such as an IGBT, MOSFET or bipolar transistor, equipped with a positive terminal (as a collector terminal in FIG. 1), a negative terminal (as an emitter terminal in FIG. 1) and a control terminal (as a gate terminal in FIG. 1). IGBT is an abbreviation for Insulated-Gate Bipolar Transistor. MOSFET is an abbreviation for Metal Oxide Semiconductor Field Effect Transistor.

The positive terminal of each of the three upper switches 31-33 is connected to the positive wiring 30p. The negative terminal of each of the three lower switches 34-36 is connected to the negative wiring 30n.

The three-phase coil 50 includes three coils 51-53: a U-phase coil 51, a V-phase coil 52, and a W-phase coil 53. These three coils 51-53 are star-connected in the present embodiment. That is, one end of the U-phase coil 51, one end of the V-phase coil 52, and one end of the W-phase coil 53 are connected to each other at the neutral point C. Alternatively, the three coils 51-53 may be delta-connected.

The opposite end of the U-phase coil 51 from the neutral point C is connected to the negative terminal of the U-phase upper switch 31 and the positive terminal of the U-phase lower switch 34 via the U-phase wiring 30u. The opposite end of the V-phase coil 52 from the neutral point C is connected to the negative terminal of the V-phase upper switch 32 and the positive terminal of the V-phase lower switch 35 via the V-phase wiring 30v. The opposite end of the W-phase coil 53 from the neutral point C is connected to the negative terminal of the W-phase upper switch 33 and the positive terminal of the W-phase lower switch 36 via the W-phase wiring 30w.

In the following, the potential on the U-phase wiring 30u is referred to as a U-phase potential Vu, the potential on the V-phase wiring 30v as a V-phase potential Vv, and the potential on the W-phase wiring 30w as a W-phase potential Vw.

The switch drive device 40 includes a total of six drive circuits 41-46, consisting of three upper drive circuits 41-43 and three lower drive circuits 44-46. The three upper drive circuits 41-43 consists of a U-phase upper drive circuit 41, a V-phase upper drive circuit 42, and a W-phase upper drive circuit 43. The three lower drive circuits 44-46 consist of a U-phase lower drive circuit 44, a V-phase lower drive circuit 45, and a W-phase lower drive circuit 46.

Each of the six drive circuits 41-46 includes a reference-potential terminal, which is a negative-electrode-side terminal, and an output terminal, which is a positive-electrode-side terminal. The U-phase upper drive circuit 41 has its reference-potential terminal connected to the U-phase wiring 30u, and its output terminal connected to the control terminal of the U-phase upper switch 31. The V-phase upper drive circuit 42 has its reference-potential terminal connected to the V-phase wiring 30v, and its output terminal connected to the control terminal of the V-phase upper switch 32. The W-phase upper drive circuit 43 has its reference-potential terminal connected to the W-phase wiring 30w, and its output terminal connected to the control terminal of the W-phase upper switch 33. From the above, the reference potential of the U-phase upper drive circuit 41 is a U-phase potential Vu, the reference potential of the V-phase upper drive circuit 42 is a V-phase potential Vv, and the reference potential of the W-phase upper drive circuit 43 is a W-phase potential Vw.

The U-phase lower drive circuit 44 has its reference-potential terminal connected to the negative wiring 30n, and its output terminal connected to the control terminal of the U-phase lower switch 34. The V-phase lower drive circuit 45 has its reference-potential terminal connected to the negative wiring 30n and its output terminal connected to the control terminal of the V-phase lower switch 35. The W-phase lower drive circuit 46 has its reference-potential terminal connected to the negative wiring 30n and its output terminal connected to the control terminal of the W-phase lower switch 36. From the above, the reference potential of each of the three lower drive circuits 44-46 is a negative-electrode potential Vn.

The switch drive device 40 includes a control circuit 48 that controls these six drive circuits 41-46. The control circuit 48 is powered by an accessory battery 19. By controlling the six drive circuits 41-46, the control circuit 48 DUTY-controls the six switches 31-36 so that 3-phase AC current flows through the 3-phase coil 50. Since such DUTY-control is be known, its detailed description will be omitted.

In such DUTY-control, the U-phase lower switch 34 is turned off at the timing when the U-phase upper switch 31 is turned on and the U-phase lower switch 34 is turned on at the timing when the U-phase upper switch 31 is turned off. In the following, the state in which the U-phase upper switch 31 is ON and the U-phase lower switch 34 is OFF is referred to as a U-phase ON state, and the state in which the U-phase upper switch 31 is OFF and the U-phase lower switch 34 is ON is referred to as a U-phase OFF state.

Similarly, the state in which the V-phase upper switch 32 is ON and the V-phase lower switch 35 is OFF is referred to as a V-phase ON state, and the state in which the V-phase upper switch 32 is OFF and the V-phase lower switch 35 is ON is referred to as a V-phase OFF state. Similarly, the state in which the W-phase upper switch 33 is ON and the W-phase lower switch 36 is OFF is referred to as a W-phase ON state, and the state in which the W-phase upper switch 33 is OFF and the W-phase lower switch 36 is ON is referred to as a W-phase OFF state.

In the circuit configuration described above, the U-phase potential Vu becomes the positive-electrode potential Vp in the U-phase ON state, and becomes the negative-electrode potential Vn in the U-phase OFF state. Similarly, the V-phase potential Vv becomes the positive-electrode potential Vp in the V-phase ON state, and becomes the negative-electrode potential Vn in the V-phase OFF state. Similarly, the W-phase potential Vw becomes the positive-electrode potential Vp in the W-phase ON state, and becomes the negative-electrode potential Vn in the W-phase OFF state.

The timing of transition from the U-phase ON state to the U-phase OFF state, the timing of transition from the V-phase ON state to the V-phase OFF state, and the timing of transition from the W-phase ON state to the W-phase OFF state are offset from each other. Therefore, each of the reference potentials (Vu, Vv, Vw) of the three upper drive circuits 41-43 is different from the other two reference potentials in some time periods.

On the other hand, the reference-potential terminal, which is the negative-electrode-side terminal of the control circuit 48, is connected to the body of the vehicle 90. In the following, the potential of that body is referred to as a ground potential Vg. Therefore, the reference potential of the control circuit 48 is the ground potential Vg. The positive-electrode potential Vp is higher than the ground potential Vg, and the negative-electrode potential Vn is lower than the ground potential Vg. The reference potential (Vg) of the control circuit 48 is thus different from the reference potentials (Vu, Vv, Vw, Vn) of any of the six drive circuits 41-46. This control circuit 48 is connected to each of the six drive circuits 41-46 via an isolating element 48*i* such as a coupler or capacitor.

Figure 2:
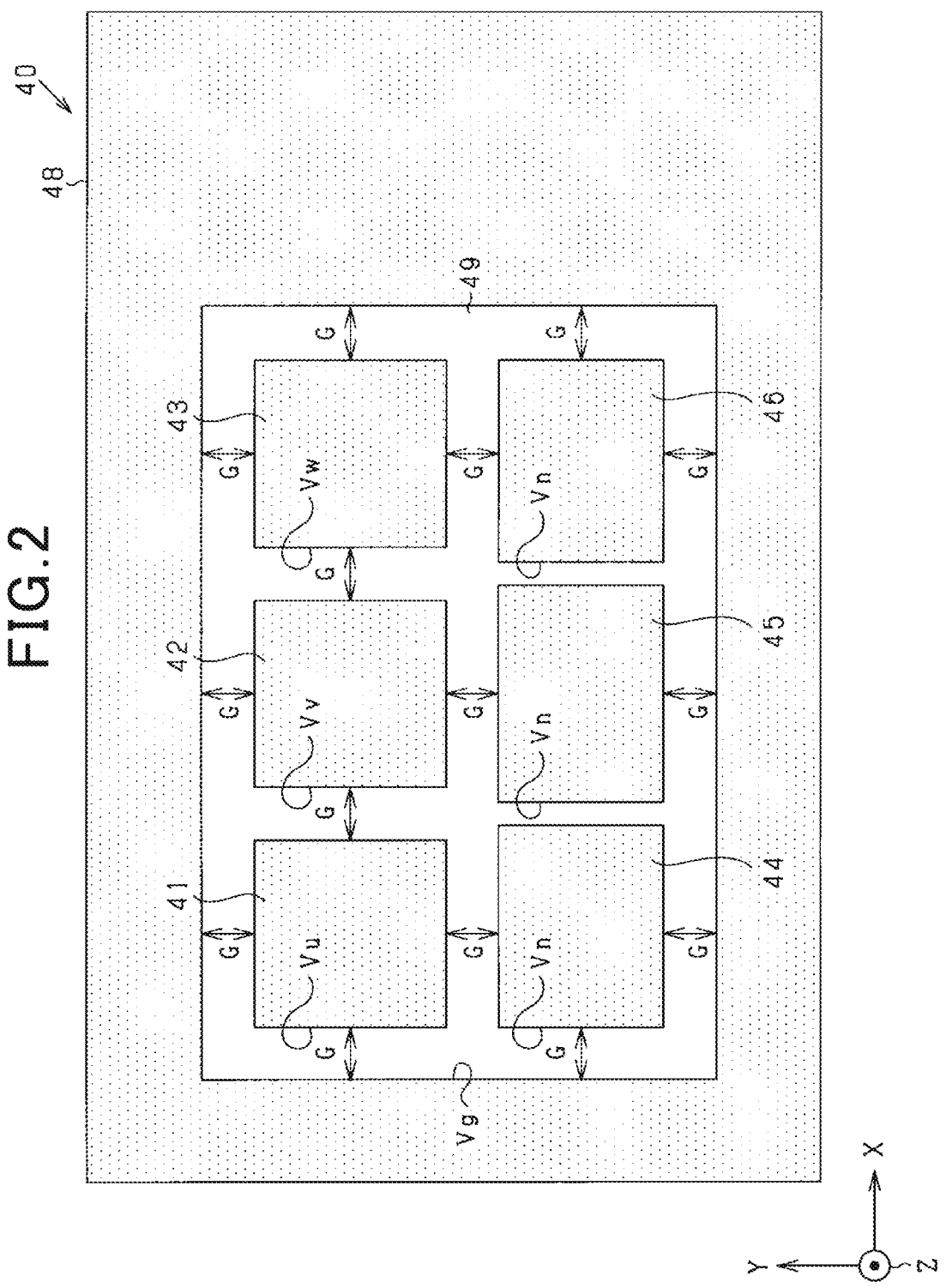
FIG. 2 is a plan view of the electronic device.

FIG. 2 is a plan view of the switch drive device 40. Each of the six drive circuits 41-46 and the control circuit 48 are mounted on an insulating substrate 49 made of a glass epoxy resin or the like. In the following, the direction of thickness of the substrate 49 is referred to as an up-down direction Z, a certain direction orthogonal to the up-down direction Z is referred to as a left-right direction X, and a direction orthogonal to both of the up-down direction Z and left-right direction X is referred to as a front-rear direction Y. However, in the present embodiment, when it says below the up-down direction Z, the left-right direction X, and the front-rear direction Y, they may be any three directions that are orthogonal to each other.

FIG. 2 is a plan view of the switch drive device 40 as viewed from a top-down perspective. In the following, this top-down plan view is simply referred to as a plan view. The three upper drive circuits 41-43 are arranged side-by-side in the left-right direction X. Specifically, the V-phase upper drive circuit 42 is provided to the right of the U-phase upper drive circuit 41, and the W-phase upper drive circuit 43 is provided to the right of the V-phase upper drive circuit 42. The U-phase lower drive circuit 44 is provided preceding the U-phase upper drive circuit 41, the V-phase lower drive circuit 45 is provided preceding the V-phase upper drive circuit 42, and the W-phase lower drive circuit 46 is provided preceding the W-phase upper drive circuit 43. The control circuit 48 surrounds the six drive circuits 41-46 from the front-rear direction Y and from the left-right direction X in plan view.

Each of the six drive circuits 41-46 has its own reference potential (Vu, Vv, Vw, Vn) at its own outer edge in plan view. The control circuit 48 has its reference potential (Vg) at its inner edge, that is, the part facing each of the six drive circuits 41-46, in plan view.

From the above, a creepage distance G is secured between the control circuit 48 and each of the six drive circuits 41-46. A creepage distance G is also secured between the three upper drive circuits 41-43 and the three lower drive circuits 44-46 and between the three upper drive circuits 41-43. That creepage distance G is about 4 mm.

The creepage distance G may not be secured between the three lower drive circuits 44-46. This is because the reference potential of each of the three lower drive circuits 44-46 is the negative-electrode potential Vn, such that the reference potentials are equal to each other.

Figure 3:
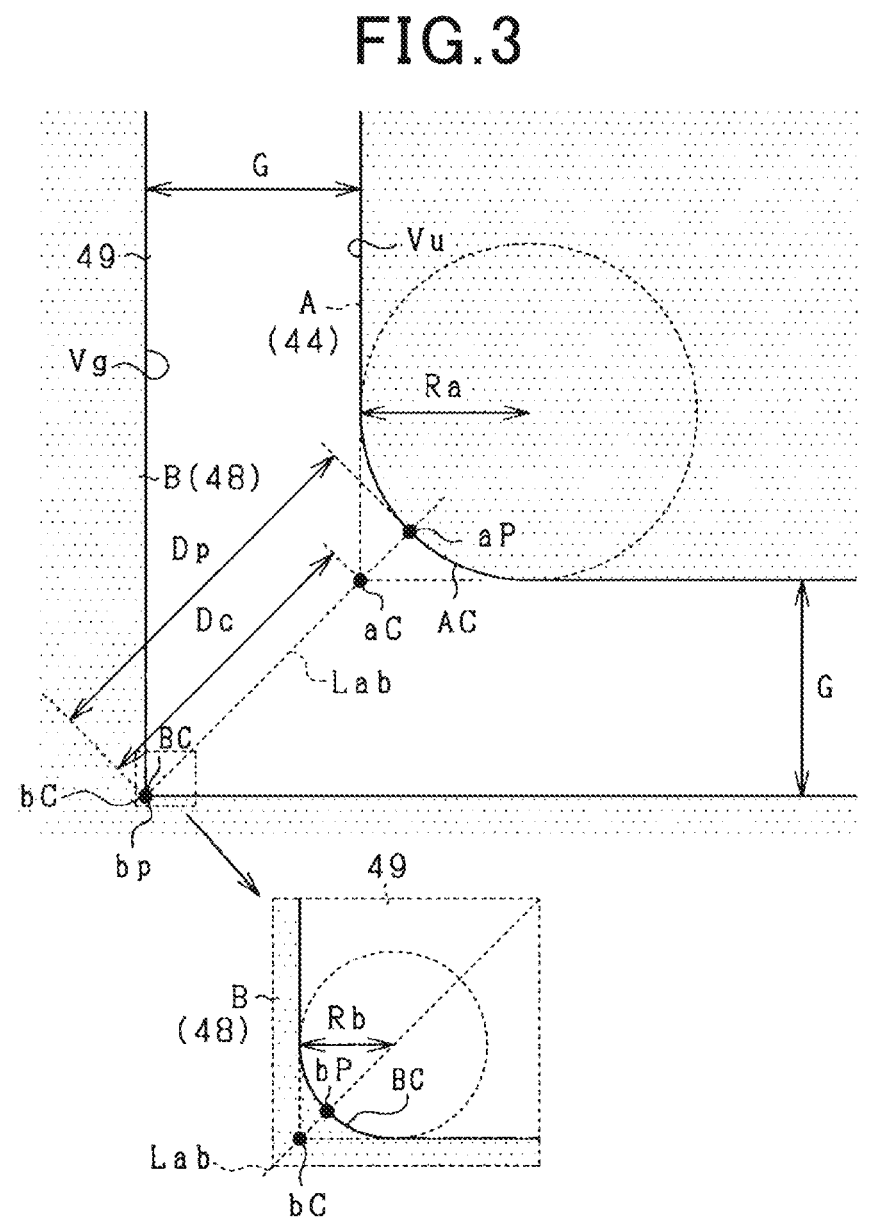

FIG. 3 is an enlarged plan view of a portion of FIG. 2, specifically the left front corner of the outer edge of the U-phase lower drive circuit 44, the left front corner of the inner edge of the control circuit 48, and their surroundings. In the following, the shape of the switch drive device 40 in plan view will now be described with reference to this FIG. 3.

In the following, one of the two conductive portions at different potentials facing each other and spaced apart from each other by the creepage distance G is referred to as a first conductive portion A, and the other is referred to as a second conductive portion B. In FIG. 3, the first conductive portion A is a conductor at the outer edge of the U-phase lower drive circuit 44, and the second conductive portion B is a conductor at the inner edge of the control circuit 48. Thus, the potential of the first conductive portion A is the negative-electrode potential Vn, and the potential of the second conductive portion B is the ground potential.

Each of the first conductive portion A and the second conductive portion B may be single layered or may be multi-layered in the up-down direction. In the case where each of the first conductive portion A and the second conductive portion B is multi-layered in the up-down direction, the multiple layers may be connected by buildup or by through-holes.

The first conductive portion A includes a convex corner AC rounded into a circular arc shape. Extensions of two straight lines forming a contour of the first conductive portion A, contiguous to the convex corner AC, form a convex angle (of less than 180 degrees). The two straight lines form the front and left sides of the outer edge of the first conductive portion A, where the convex angle here is 90 degrees. In the following, the radius of curvature of the convex corner AC is referred to as a first radius of curvature Ra.

On the other hand, the second conductive portion B includes a concave corner BC facing the convex corner AC. Extensions of two straight lines forming a contour of the second conductive portion B, contiguous to the concave corner BC, form a concave angle (of greater than 180 degrees). The two straight lines form the front and left sides of the inner edge of the second conductive portion B, where the concave angle here is 270 degrees.

In the following, the radius of curvature of the concave corner BC is referred to as a second radius of curvature Rb. The second radius of curvature Rb is less than the first radius of curvature Ra. In the present embodiment, the second radius of curvature Rb is less than or equal to 0.2 mm. The second radius of curvature Rb may preferably be as small as possible. That is, preferably, the concave corner portion BC may be rounded minimally Specifically, preferably, the concave corner BC may substantially include an apex of a concave angle.

In the following, the aforementioned apex of the convex angle is referred to as a convex-angle apex aC, and the aforementioned apex of the concave angle is referred to as a concave angle apex bC. A straight line passing through the convex-angle apex aC and the concave angle apex bC is referred to as a corner line Lab, the intersection of the corner line Lab and the convex corner AC is referred to as a convex corner point aP, and the intersection of the corner line Lab and the concave corner BC is referred to as concave corner point bP. A distance from the convex-angle apex aC to the concave angle apex bC is referred to as a distance between apices Dc, and a distance from the convex corner point aP to the concave corner point bP is referred to as a distance between corners Dp.

In the present embodiment, as described above, the second radius of curvature Rb is less than the first radius of curvature Ra. Therefore, the distance Dp between corners is greater than the distance Dc between apices. Specifically, in the present embodiment, the distance Dp between corners is 1.1 or more times the distance Dc between apices.

In the following, a section where the first conductive portion A and the second conductive portion B face each other in parallel and are spaced apart from each other by a creepage distance G is referred to as a parallel section. A section including the convex corner AC, the concave corner BC and their surroundings is referred to as a corner section. Although, in the above, the left front corner of the inner edge of the control circuit 48 illustrated in FIG. 2 has been described, the same is applicable to the left rear corner, right rear corner and right front corner, where the first conductive portion A needs to be replaced with a corresponding conductive portion as appropriate. Specifically, in the case of the left rear corner, the outer edge of the U-phase upper drive circuit 41 is deemed as the first conductive portion A. In the case of the right rear corner, the outer edge of the W-phase upper drive circuit 43 is deemed as the first conductive portion A. In the case of the right front corner, the outer edge of the W-phase lower drive circuit 46 is deemed as the first conductive portion A. In all these cases, the inner edge of the control unit 48 is deemed as the second conductive portion B.

Figures 4A, 4B:
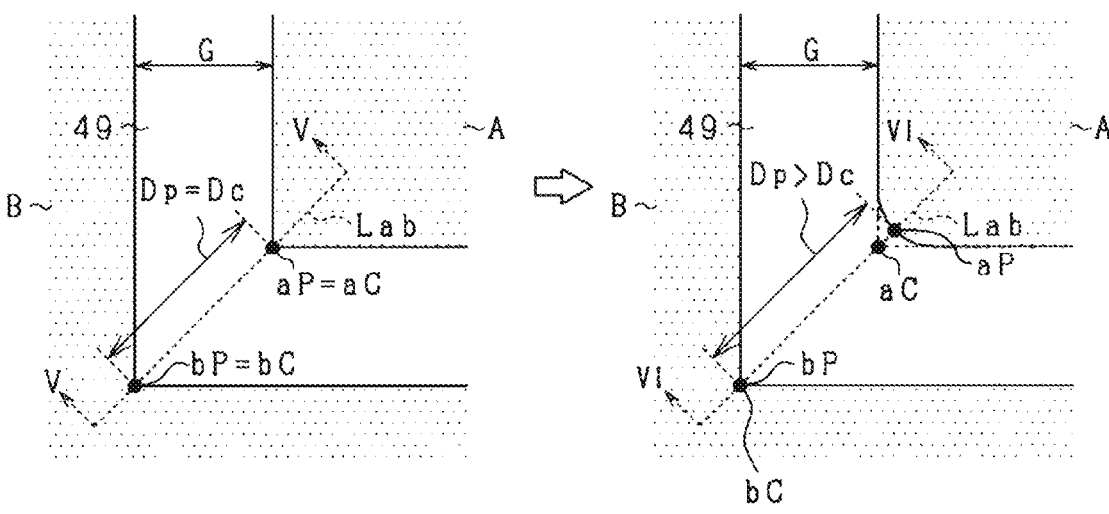
FIG. 4A is a plan view of corners and their surroundings according to a first comparative example.
FIG. 4B is a plan view of corners and their surroundings according to the first embodiment.

FIG. 4A is a plan view of the corners in Comparable Example 1, and FIG. 4B is a plan view of the corners in the present embodiment. In Comparable Example 1 illustrated in FIG. 4A, neither the convex corner AC nor the concave corner BC is rounded. Therefore, the convex corner point aP is nothing but the convex-angle apex aC, and the concave corner point bP is nothing but the concave angle apex bC. Therefore, the distance between corners Dp is equal to the distance between apices Dc.

Next, with reference to this comparative example, the points of focus in the present embodiment will now be described. Discharge between the first conductive portion A and the second conductive portion B is not necessarily initiated in the parallel section where the first conductive portion A and the second conductive portion B face each other at a creepage distance G and are closest to each other. In many cases, discharge is initiated between the convex corner point aP and the concave corner point bP, even though they are farther apart than in the parallel section. That is, it is noted that, in many cases, initiation of discharge on the corner line Lab is a rate-limiting factor for insulation breakdown.

In the present embodiment, the electric field concentration at the concave corner AC is suppressed as much as possible by making the convex corner AC rounded as illustrated in FIG. 4B. On the other hand, the distance between corners Dp that is the distance between the first conductive portion A and the second conductive portion B on the corner line Lab, which is the rate-limiting factor for insulation breakdown, is increased as much as possible by rounding the concave corner BC minimally. This makes the distance between corners Dp greater than the distance between apices Dc.

Figure 5:
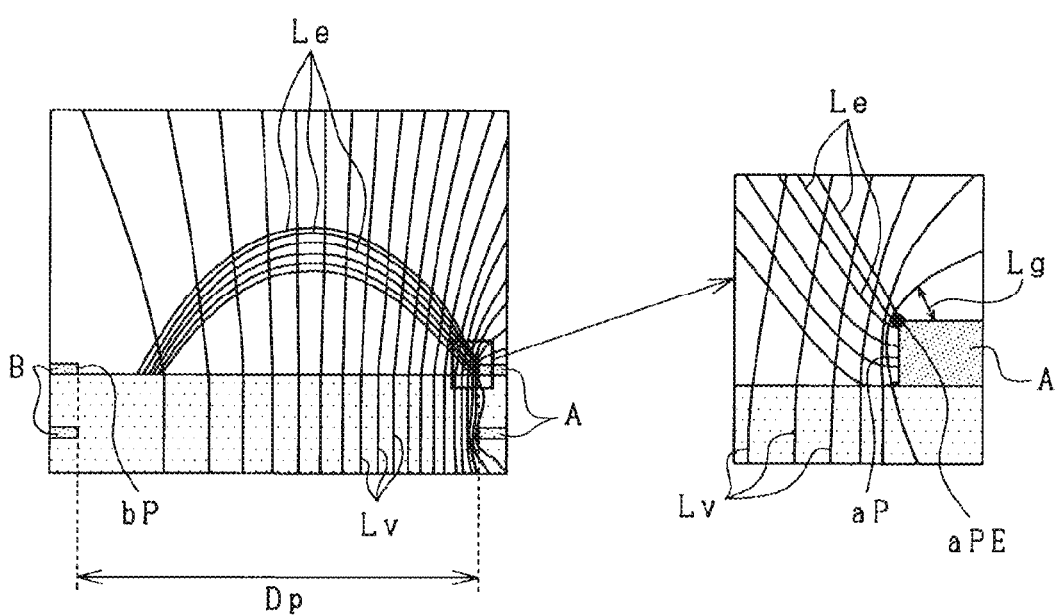
FIG. 5 is a front cross-sectional view illustrating lines of electric force and others according to the first comparative example.

FIG. 5 is a cross-sectional view, taken along the V-V line, of the corner of a first comparative example illustrated in FIG. 4A, that is, a cross-sectional view taken along the corner line Lab. Here, it is assumed that the first conductive portion A and the second conductive portion B are each multi-layered in the up-down direction, and that the multiple layers of the first conductive portion A are at the same potential as each other and the multiple layers of the second conductive portion B are at the same potential as each other. This is also the case in FIG. 6 described below. In the following, the edge of the top surface of the first conductive portion A, closer to the second conductive portion B, is referred to as a first edge aPE in that cross-section.

That is, the first edge aPE is the upper edge of the convex corner point aP. Among the convex corner points aP where the electric field concentration occurs in plan view, the electric field concentration occurs at the first edge aPE in that plan view. From that fact, electric lines of force Le are emitted from the first edge aPE in directions that are oblique upward to the direction to the second conductive portion B. This is because each electric line of force Le is emitted in a direction perpendicular to an equipotential line Lv. For example, since the equipotential lines Lv extend along the top surface of the first conductive portion A, the electric lines of force Le are emitted upward. On the other hand, since the equipotential lines Lv extend in the up-down direction Z at the end surface of the first conductive portion A, on the second conductive portion B side, the electric force lines Le are emitted toward the second conductive portion B. From the above, the electric lines of force Le are emitted from the first edge aPE in intermediate directions that are oblique and upward to the direction to the second conductive portion B.

From the above, the electric lines of force Le from the first edge aPE draws a parabola and reaches a proximal portion of the concave corner point bP. The reason why the electric lines of force Le do not reach the concave corner point bP, but rather reach the proximal portion of the concave corner point bP, is that, near the concave corner BC in plan view, the equipotential lines Lv do not bend along the edge of the concave corner BC, but extend out in a gentle short cut manner inside the edge of the concave corner BC.

Figure 6:
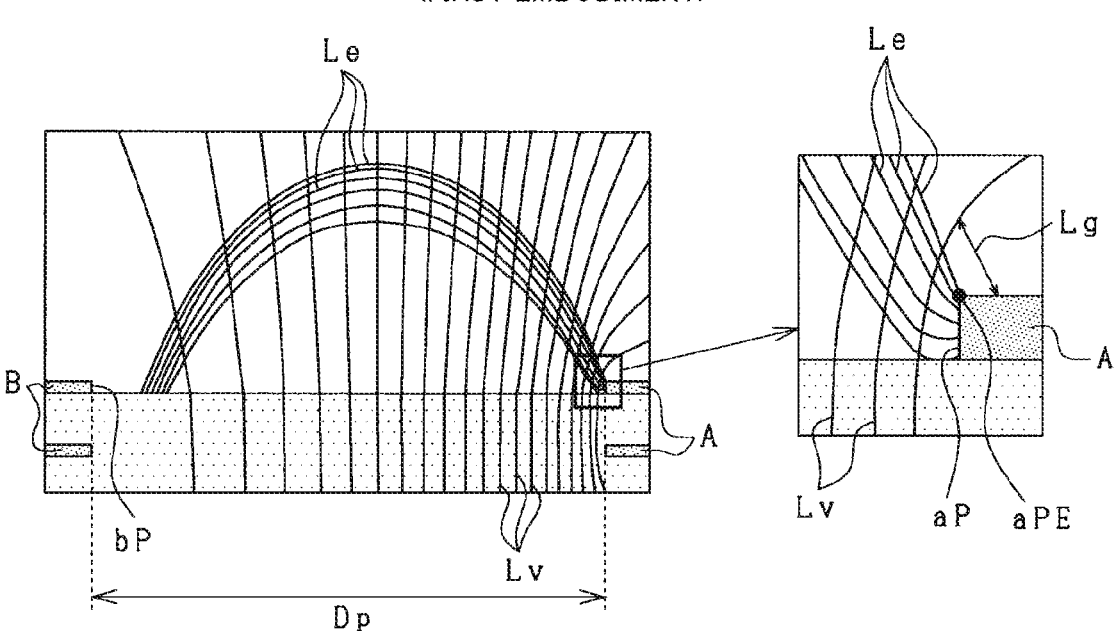
FIG. 6 is a front cross-sectional view illustrating lines of electric force and others according to the first embodiment.

FIG. 6 is a cross-sectional view, taken along the VI-VI line, that is, taken along the corner line Lab, of the corners of the present embodiment illustrated in FIG. 4B. In the present embodiment, as described above, the convex corner AC is rounded in plan view, thereby suppressing the electric field concentration at the convex corner point aP. Furthermore, in the present embodiment, the distance between corners Dp is greater than the distance between apices Dc, which leads to the distance between corners Dp greater than in the first comparative example. As a result, in the present embodiment illustrated in FIG. 6, a spacing Lg of the equipotential lines Lv is greater than in the first comparative example illustrated in FIG. 5. Therefore, as compared to the first comparative example, discharge between the first conductive portion A and the second conductive portion B in the corner section is suppressed. That is, the discharge inception voltage becomes higher.

Figure 7:
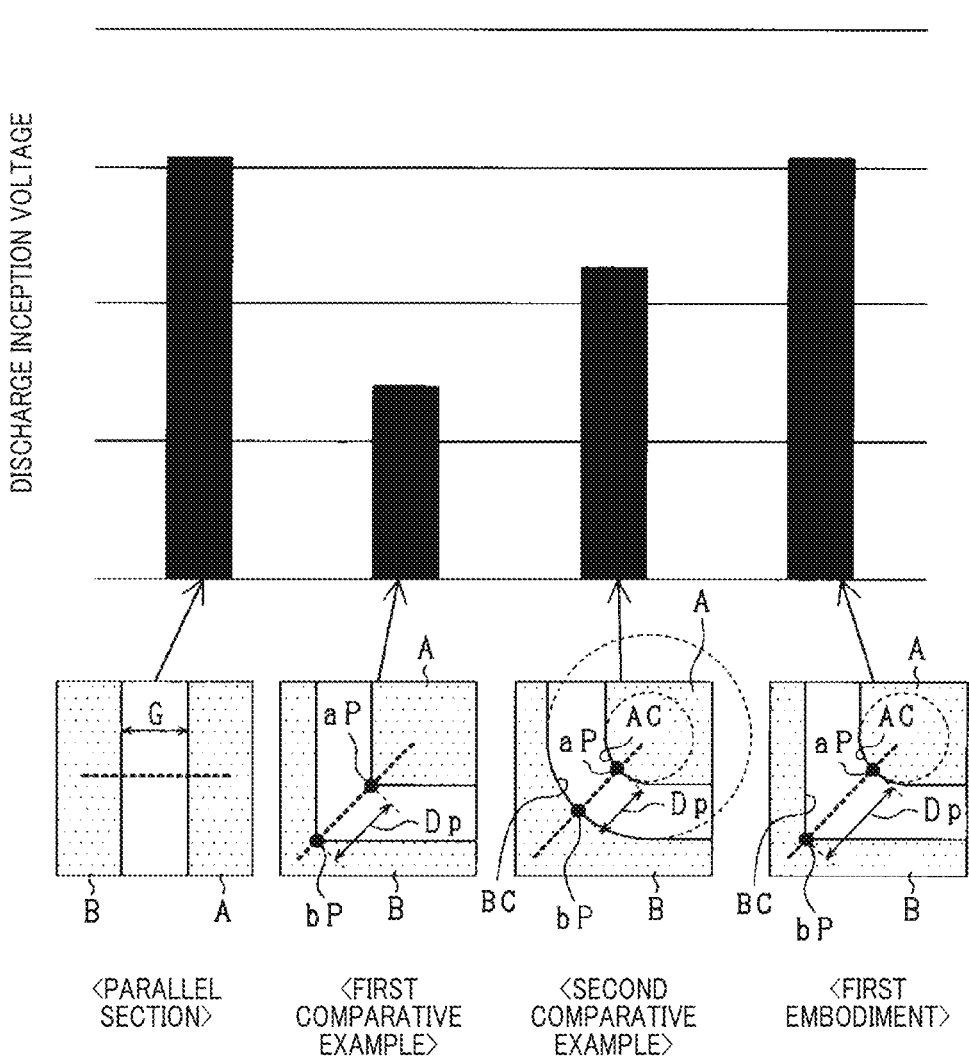
FIG. 7 is a graph illustrating a discharge inception voltage for each corner shape.

FIG. 7 is a graph illustrating differences in discharge inception voltage for different corner shapes, specifically, discharge inception voltages for sections indicated by the thick dashed lines. The higher the discharge inception voltage is, the unlikely discharge is to initiate. The present inventors have found that, as described above, discharge is more likely to occur in the corner section of Comparable Example 1, illustrated right adjacent to the parallel section illustrated at the left end of FIG. 7, than in the parallel section. That is, even though the distance between corners Dp in the first comparative example is $\sqrt{2}$ times the creepage distance G in the parallel section, the present inventors have found that discharge is more likely to occur in the corner section of the first comparative example than in the parallel section. Indeed, the discharge inception voltage is lower in the corner section of the first comparative example than in the parallel section.

In a second comparative example illustrated right adjacent to the first comparative example, the convex corner AC is rounded and the concave corner BC is rounded parallel to it, the electric field concentration at the convex corner point aP is mitigated, which makes it more unlikely for discharge to occur than in the first comparative example. However, in the second comparative example, the distance between corners Dp is rather less than in the first comparative example, and becomes equal to the creepage distance G in the parallel section. Thus, in this respect, discharge is rather more likely to occur. However, the positive effect of rounding the concave corner AC overwhelms the negative effect of shortening the distance between corners Dp. Therefore, in total, as illustrated in FIG. 7, discharge is more unlikely to occur in the second comparative example than in the first comparative example, and the discharge inception voltage becomes higher than in the first comparative example.

In this respect, in the present embodiment illustrated in FIG. 7, the convex corner AC is rounded while the concave corner BC is rounded minimally to suppress the electric field concentration at the convex corner point aP, and the distance between corners Dp is thereby made greater than in the first and second comparative examples. This makes it even more unlikely for discharge to occur than in the second comparative example, and the discharge inception voltage is even higher. As a result, in the present embodiment, the discharge inception voltage in the corner section is substantially equal to the discharge inception voltage in the parallel section, and the corner section is prevented from becoming the rate-limiting factor for insulation breakdown.

The advantages of the present embodiment will now be summarized.

In the present embodiment, the convex corner AC is rounded. This allows the electric field concentration at the convex corner point aP to be suppressed as much as possible, thereby suppressing discharge at the convex corner AC.

Furthermore, the distance between corners Dp is greater than the distance between apices Dc. This can further suppress electrical discharge by increasing the distance from the first conductive portion A to the second conductive portion B on the corner line Lab, which is the rate-limiting factor for insulation breakdown, as much as possible.

Moreover, according to the present embodiment, discharge can be suppressed only by circuit design, without use of an encapsulating resin or the like, which can also suppress cost increases in materials and manufacturing. Furthermore, since there is no need to encapsulate the conductors with the encapsulating resin or the like, there is no concern about degradation of insulation caused by resin peeling due to aging.

According to the present embodiment, discharge can be suppressed while suppressing concerns about cost increases in materials and manufacturing, as well as insulation degradation due to aging.

In the present embodiment, the second radius of curvature Rb is less than the first radius of curvature Ra. Specifically, the second radius of curvature Rb is less than or equal to 0.2 mm. This can efficiently make the distance between corners Dp greater than the distance between apices Dc.

In the present embodiment, the first conductive portion A comprises the outer edges of the drive circuits 41, 43, 44, and 46 that constitute the switch drive device 40, and the second conductive portion B comprises the inner edge of the control circuit 48 that constitutes the switch drive device 40. Therefore, in the switch drive device 40, the above advantages result.

OTHER EMBODIMENTS

The above embodiment may be modified and implemented as follows.

Figure 8:
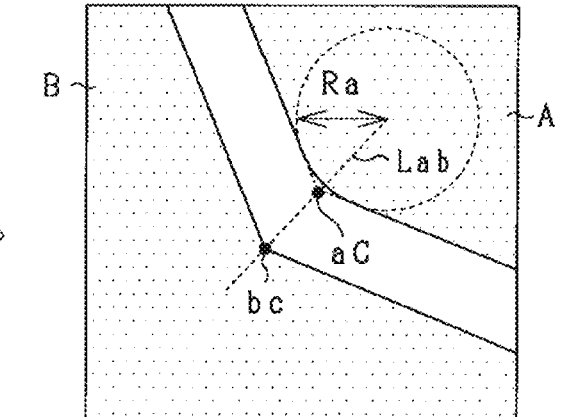
FIG. 8 is a plan view of corners and their surroundings according to a first modification.
Figure 9:
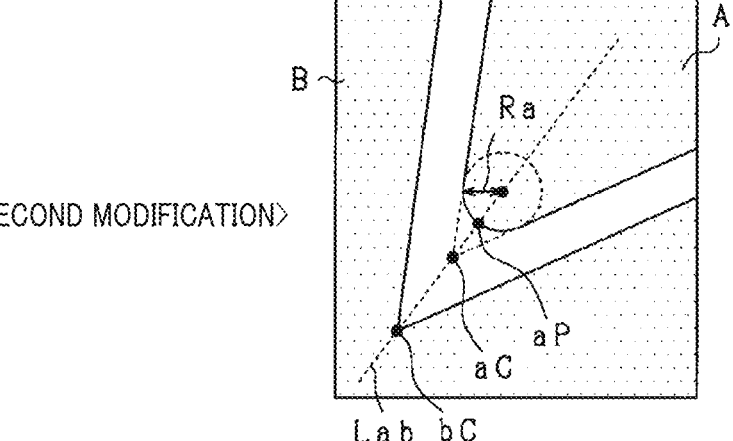
FIG. 9 is a plan view of corners and their surroundings according to a second modification.

In the first embodiment, the convex angle is 90 degrees and the concave angle is 270 degrees. Alternatively, as in a first modification illustrated in FIG. 8, the convex angle may be obtuse, that is, greater than 90 degrees, and the concave angle may be less than 270 degrees. Still alternatively, the convex angle may be acute, that is, less than 90 degrees, and the concave angle may be greater than 270 degrees, as in a second modification illustrated in FIG. 9.

Figure 10:
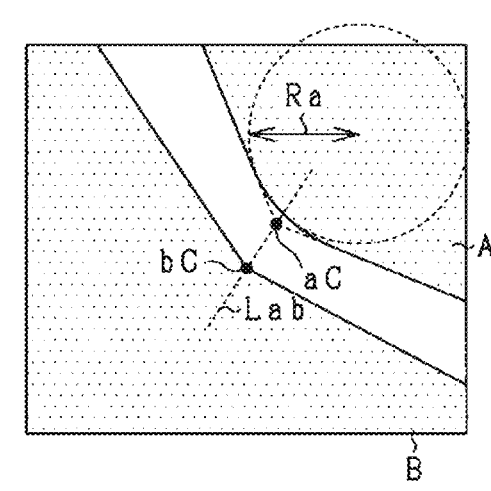
FIG. 10 is a plan view of corners and their surroundings according to a third modification.

In the first embodiment, the sum of the convex angle (90 degrees) and the concave angle (270 degrees) is 360 degrees. Alternatively, as in a third modification illustrated in FIG. 10, the sum of the convex angle and the concave angle may be less or greater than 360 degrees.

Figure 11:
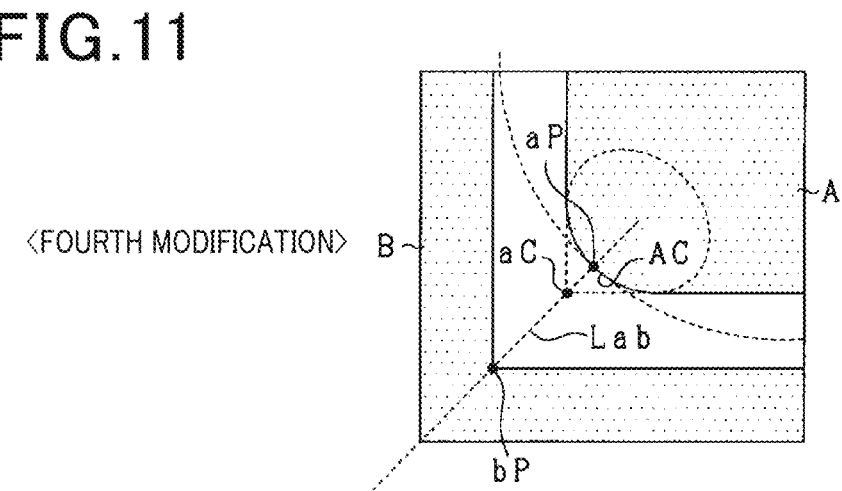
FIG. 11 is a plan view of corners and their surroundings according to a fourth modification.
Figure 12:
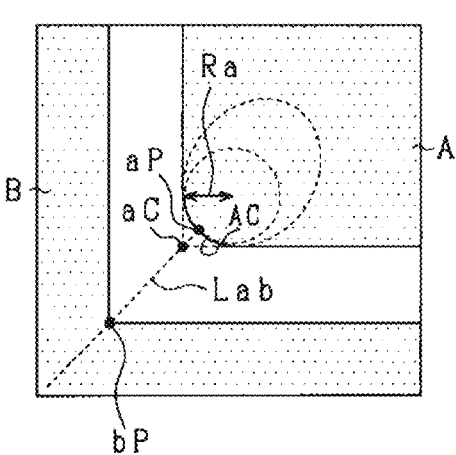
FIG. 12 is a plan view of corners and their surroundings according to a fifth modification.

In the first embodiment, the convex corner AC is rounded into a circular arc shape. Alternatively, as illustrated in FIGS. 11 and 12, for example, the convex corner AC may be rounded into an elliptical arc shape. Specifically, as in a fourth modification illustrated in FIG. 11, for example, the convex corner AC may be rounded into an elliptical arc shape near the short axis of the ellipse. In this case, the radius of curvature Ra of the convex corner AC is the radius of the circumcircle tangent to the ellipse at the convex corner point aP. For example, as in a fifth modification illustrated in FIG. 12, the convex corner AC may be rounded into an elliptical arc shape near the long axis of the ellipse. In this case, the radius of curvature of the convex corner AC is the radius of the incircle tangent to the ellipse at the convex corner point aP.

Figure 13:
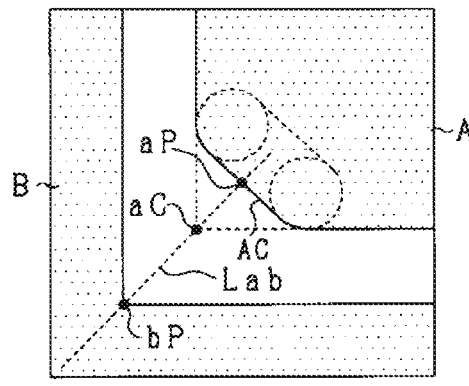
FIG. 13 is a plan view of corners and their surroundings according to a sixth modification.

In the first embodiment, the convex corner AC is rounded into a circular arc shape. Alternatively, as in a sixth modification illustrated in FIG. 13, the convex corner AC may be rounded into an oblong-circular arc shape.

The above embodiment and its modifications may further be modified and implemented as follows.

In the first and other embodiments, the switch drive circuit is configured to maximize the distance between corners Dp by rounding the convex corner AC and rounding the concave corner BC minimally. Alternatively, such a configuration may be adopted in any circuit other than the switch drive circuit that includes the convex corner AC and the concave corner BC.

In the first and other embodiments, the second radius of curvature Rb is less than or equal to 0.2 mm. Alternatively, the second radius of curvature Rb may be greater than or equal to 0.2 mm as long as the distance between corners Dp is greater than the distance between apices Dc.

In the first and other embodiments, the distance between the corners Dp is at least 1.1 times the distance between apices Dc. Alternatively, the distance between the corners Dp is less than 1.1 times the distance between apices Dc. However, even in such cases, it is preferable that the distance between the corners Dp be at least equal to or greater than 1.05 times the distance between apices Dc, and it is more preferable that the distance between the corners Dp be at least equal to or greater than 1.07 times the distance between apices Dc so as to sufficiently display the effect of suppressing discharge.

In the case of the first conductive portion A being multi-layered, not only the first conductive portion A of the surface layer but also the first conductive portion A of the inner layer may be provided with the convex corner AC of the same shape as that of the first conductive portion A of the surface layer. In the case of the second conductive portion B being multi-layered, not only the second conductive portion B of the surface layer but also the second conductive portion B of the inner layer may be provided with the concave corner portion BC of the same shape as that of the second conductive portion B of the surface layer.

Although the present disclosure has been described in accordance with the above-described embodiments, it is not limited to such embodiments, but also encompasses various variations and variations within equal scope. In addition, various combinations and forms, as well as other combinations and forms, including only one element, more or less, thereof, are also within the scope and idea of the present disclosure.

What is claimed is:

1. An electronic device comprising:
a substrate; and
circuitry mounted on the substrate, the circuitry including a first conductive portion and a second conductive portion at a different potential from the first conductive portion, wherein, in plan view in a thickness direction of the substrate,
the first conductive portion includes a rounded convex corner, and the second conductive portion includes a concave corner facing the convex corner,
extensions of two straight lines forming a contour of the first conductive portion, contiguous to the convex corner, intersect at a first apex of a convex angle,
extensions of two straight lines forming a contour of the second conductive portion, contiguous to the concave corner, intersect at a second apex of a concave angle,
a distance between corners, which is a distance between a convex corner point and a concave corner point, is greater than a distance between apices, which is a distance between the first apex and the second apex, with the convex corner point being an intersection of a corner line, which is a straight line passing through the first apex and the second apex, and the convex corner, and the concave corner point being an intersection of the corner line and the concave corner,
the circuitry includes a drive circuit that drives a switch of an inverter and a control circuit that controls the drive circuit, and
the first conductive portion is a portion of the drive circuit and, the second conductive portion is a portion of the control circuit.

2. The electronic device according to claim 1, wherein a radius of curvature for the concave corner is less than a radius of curvature for the convex corner.

3. The electronic device according to claim 2, wherein the radius of curvature for the concave corner is less than or equal to 0.2 mm.

4. The electronic device according to claim 1, wherein the concave corner substantially comprises an apex of a concave angle.

5. An electronic device comprising:
a substrate; and
circuitry mounted on the substrate, the circuitry including a first conductive portion and a second conductive portion at a different potential from the first conductive portion, wherein, in plan view in a thickness direction of the substrate,
the first conductive portion includes a rounded convex corner,
the second conductive portion includes a concave corner facing the convex corner, the concave corner including a substantial apex of a concave angle,
the circuitry includes a drive circuit that drives a switch of an inverter and a control circuit that controls the drive circuit, and
the first conductive portion is a portion of the drive circuit and, the second conductive portion is a portion of the control circuit.

* * * * *